(12) United States Patent
Peck (10) Patent No.: US 8,907,368 B2
(45) Date of Patent: Dec. 9, 2014

(54) DOUBLE COLLIMATOR LED COLOR MIXING SYSTEM

(75) Inventor: John Patrick Peck, Manasquan, NJ (US)

(73) Assignee: Dialight Corporation, Farmingdale, NJ (US)

( * ) Notice: Subject to any disclaimer, the term of this patent is extended or adjusted under 35 U.S.C. 154(b) by 738 days.

(21) Appl. No.: 12/266,858

(22) Filed: Nov. 7, 2008

(65) Prior Publication Data

US 2009/0121238 A1    May 14, 2009

Related U.S. Application Data

(60) Provisional application No. 60/986,430, filed on Nov. 8, 2007.

(51) Int. Cl.
| | | |
|---|---|---|
| H01L 33/00 | (2010.01) |
| F21V 13/04 | (2006.01) |
| G02B 19/00 | (2006.01) |
| F21V 7/04 | (2006.01) |
| F21V 7/09 | (2006.01) |
| F21Y 101/02 | (2006.01) |
| G02B 5/02 | (2006.01) |
| H01L 25/075 | (2006.01) |
| H01L 33/60 | (2010.01) |

(52) U.S. Cl.
CPC ............ *F21V 13/04* (2013.01); *G02B 19/0066* (2013.01); *G02B 19/0028* (2013.01); *F21V 7/04* (2013.01); *F21V 7/09* (2013.01); *F21Y 2101/02* (2013.01); *G02B 5/02* (2013.01); *H01L 25/0753* (2013.01); *H01L 33/60* (2013.01); *H01L 2924/0002* (2013.01)
USPC .. 257/99; 257/98; 257/E33.057; 257/E33.067

(58) Field of Classification Search
USPC ....................... 257/98, 99, E33.057, E33.067
See application file for complete search history.

(56) References Cited

U.S. PATENT DOCUMENTS

| | | | |
|---|---|---|---|
| 7,070,300 B2 | 7/2006 | Harbers et al. | |
| 2004/0070855 A1 * | 4/2004 | Benitez et al. | 359/858 |
| 2005/0024744 A1 * | 2/2005 | Falicoff et al. | 359/737 |
| 2006/0146516 A1 | 7/2006 | Li et al. | |
| 2006/0221611 A1 | 10/2006 | Noh et al. | |
| 2006/0239006 A1 | 10/2006 | Chaves et al. | |

FOREIGN PATENT DOCUMENTS

WO     WO2006033031     *    3/2006

OTHER PUBLICATIONS

PCT Search Report and Written Opinion for PCT/US08/82825, Dec. 24, 2008.

* cited by examiner

*Primary Examiner* — Matthew Reames (57) ABSTRACT

The present invention is directed to a lighting apparatus. In one embodiment the lighting apparatus includes a plurality of light emitting diode (LED) chips. A first optic is coupled to the plurality of LED chips. A diffuser is coupled to the first optic. In addition, a second optic is coupled to the diffuser.

18 Claims, 6 Drawing Sheets

DOUBLE COLLIMATOR LED COLOR MIXING SYSTEM

RELATED APPLICATIONS

This application claims priority under 35 U.S.C. §119(e) to U.S. provisional patent application Ser. No. 60/986,430, filed on Nov. 8, 2007, which is hereby incorporated by reference in its entirety.

FIELD OF THE INVENTION

The present invention is directed to a lighting system that mixes and collimates multicolored light emitting diodes (LEDs).

BACKGROUND OF THE INVENTION

Multicolored light emitting diode (LED) chips are commonly used in lighting applications where dynamic color mixing is desired. For example, the light from different colored LED chips can be mixed and their respective brightness adjusted to give white or most other colors. One of the challenges in these applications has been to mix the different colored LED chips without having unpleasant color fringing or shadowing. Dichroic color filters can be used to combine the different colored LED chips, but this is very expensive. In addition, the use of dichroic color filters only works with highly pre-collimated light, and is often inefficient.

A chamber with diffuse reflecting walls can also be used to mix the various colored light from multiple LED chips. The chamber has an aperture so that the mixed light can escape. This method also has significant light loss and is costly.

SUMMARY OF THE INVENTION

The present invention relates generally to a lighting apparatus. In one embodiment, the lighting apparatus comprises a plurality of light emitting diode (LED) chips, a first optic coupled to said plurality of LED chips, a diffuser coupled to said first optic and a second optic coupled to said diffuser.

In one embodiment, the present invention provides a lighting apparatus. The lighting apparatus comprises one or more light emitting means, a first means for redirecting light emitted from said one or more light emitting means coupled to said one or more light emitting means, means for diffusing said light emitted from said one or more light emitting means coupled to said first means for redirecting said light emitted from said one or more light emitting means and a second means for redirecting light emitted from said one or more light emitting means coupled to said means for diffusing.

In one embodiment, the present invention provides a method for eliminating color fringing. In one embodiment, the method comprises providing a first light source comprising light emitted from each one of one or more light emitting diode (LED) chips, redirecting said first light source towards a diffuser and collimating a second light source emitted from said diffuser.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
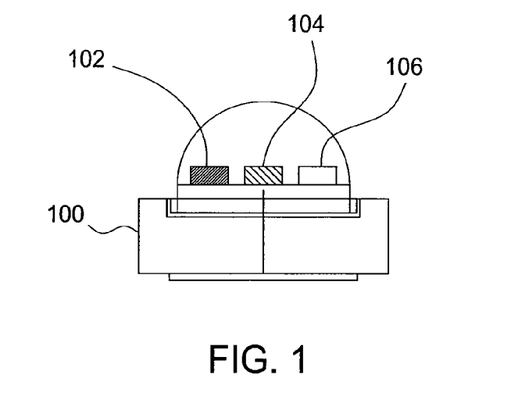
FIG. 1 depicts an illustrative multi-chip package.

Currently, light emitting diodes (LEDs) are now becoming available in high-power multi-chip packages. As illustrated by FIG. 1, a high-power multi-chip package 100 may include one or more LED chips 102, 104 and 106. The one or more LED chips 102, 104 and 106 may also be referred to herein interchangeably as one or more LED dice. Although only three LED chips 102, 104 and 106 are illustrated in FIG. 1, those skilled in the art may recognize that there may be any number of LED chips 102, 104 and 106. Thus, illustrating the use of three LED chips 102, 104 and 106 is not intended to limit the number of LED chips in any way. The one or more LED chips 102, 104 and 106 may each be a different color, for example red, green and blue. Notably, in the high power multi-chip package 100, the one or more LED chips 102, 104 and 106 are positioned very close together or even side-by-side.

Figure 2:
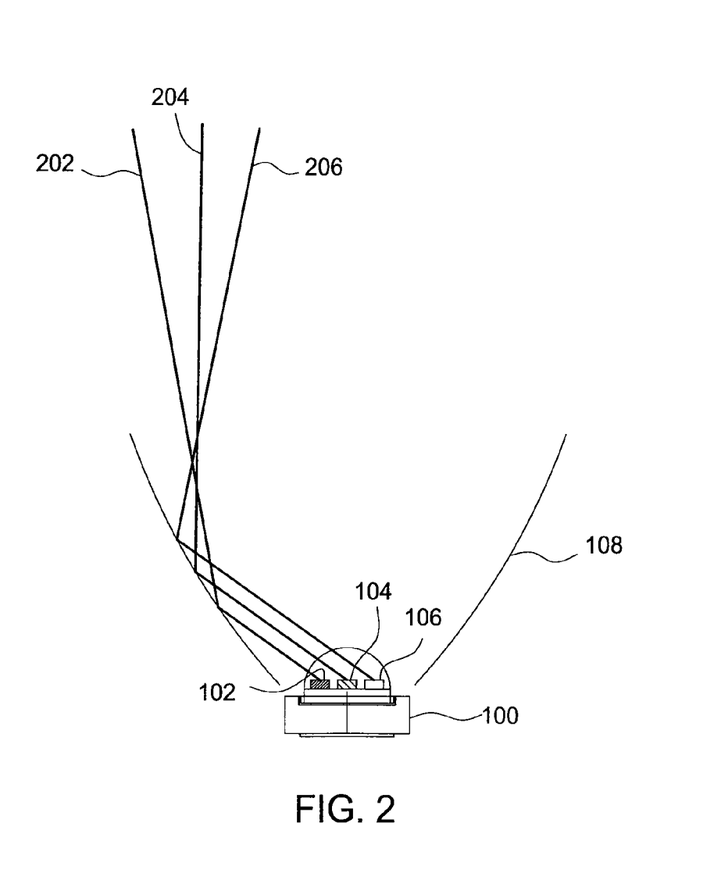
FIG. 2 depicts an illustrative multi-chip package with a collimating optic.

FIG. 2 illustrates a first optic 108 such as a lens and/or reflector can be used to redirect a light emitted from each one of the one or more LED chips 102, 104 and 106. In one embodiment, the first optic 108 may be designed to also collimate the light emitted from teach one of the one or more LED chips 102, 104 and 106. In one embodiment, the light is directed forward. However, the light emitted would have significant color fringing using only the first optic 108. Color fringing may occur when different wavelengths of light are directed onto nearby areas with varying intensity levels. That is to say that a consistent color will not be seen across the lighted area but instead the color variation similar to a rainbow effect could be seen.

For example, where the one or more LED chips 102, 104 and 106 are each a different color such as red, green and blue, each of the one or more LED chips 102, 104 and 106 may emit a light having different wavelengths associated with each respective color. Due to the positioning of each one of the one or more LED chips 102, 104 and 106, the light emitted from each one of the one or more LED chips 102, 104 and 106 are not positioned at the same position within the first optic 108. As a result, color fringing may occur.

The above example of color fringing is illustrated in FIG. 2. In FIG. 2, the LED chip 104 may emit a green light and is positioned at the focal point of the first optic 108 and is, therefore, well collimated. The LED chip 102 that may emit a red light and the LED chip 106 that may emit a blue light are not at the focal point and their light rays are, therefore, directed off axis, as illustrated by lines 202, 204 and 206. This results in an objectionable color fringing, discussed above, when illuminating a surface.

Figure 3:
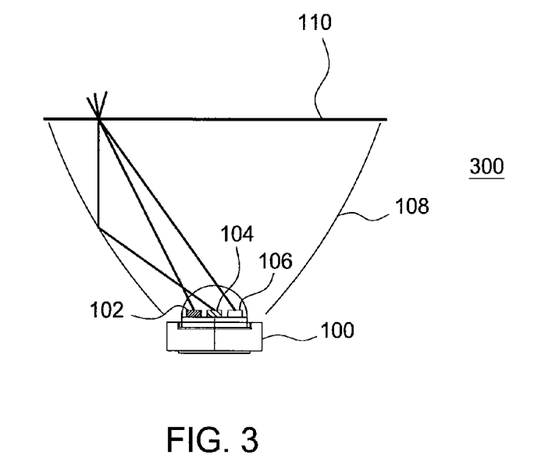
FIG. 3 depicts an example of the collimating optic and a diffuser.

One embodiment of the present invention is illustrated by a light apparatus 300 illustrated in FIG. 3. In one embodiment, the color fringing may be eliminated by using a diffuser 110, as illustrated by FIG. 3. FIG. 3 illustrates a diffuser 110 coupled to the first optic 108 to mix the light emitted from each one of the one or more LED chips 102, 104 and 106. Those skilled in the art will recognize that "coupled to" may be defined herein as being direct or indirect. That is the diffuser 110 may be directly coupled to the first optic 108 or indirectly coupled to the first optic 108. In one embodiment, the diffuser 110 is placed forward of the first optic 108 and the one or more LED chips 102, 104 and 106.

As shown in FIG. 3 the light emitted from the one or more LED chips 102, 104 and 106 can be redistributed and/or randomized at various angles by placing the diffuser 110 forward of the first optic 108. In one example as illustrated by FIG. 3, a green light emitted by LED chip 104 reflected off of the first optic 108 may be mixed at the diffuser 110 with light received directly from a red light emitted by the LED chip 102 and a blue light emitted by the LED chip 106. This same effect will happen for all three colors throughout a surface of the diffuser 110. The light emitted from the diffuser 110 may have a substantially Lambertian emission pattern with all of the different colored light emitted by the one or more LED chips 102, 104 and 106 (e.g., a red light, a green light, and a blue light) well mixed. The diffuser 110 now becomes the new light emitting source but now has a less-collimated wide light pattern.

Figure 4:
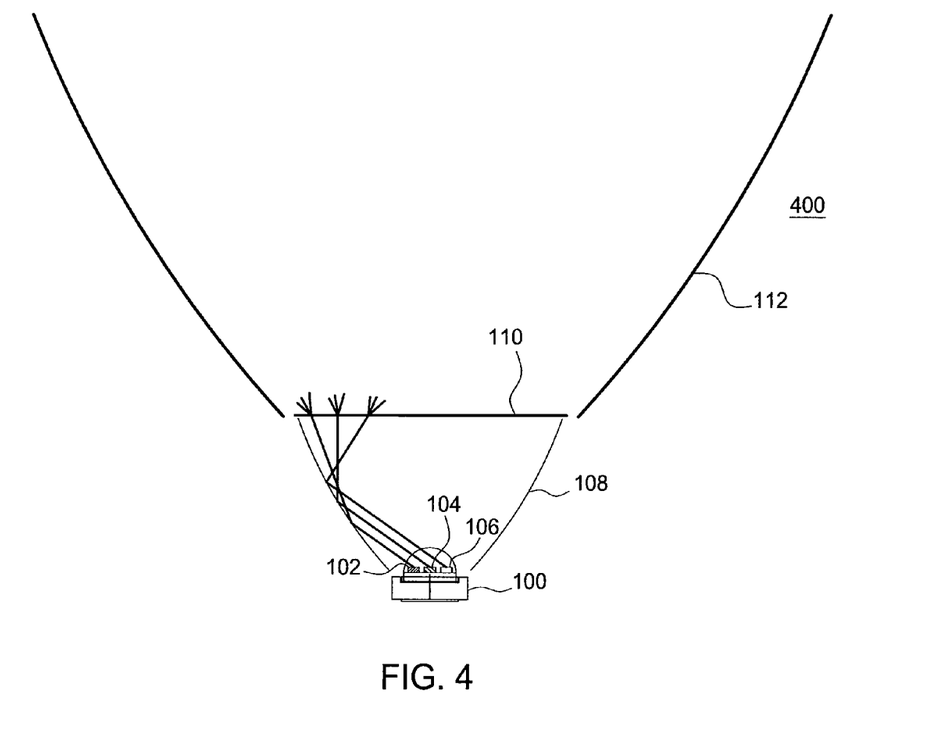
FIG. 4 depicts an illustrative first optic, diffuser and a second optic with the multi-chip package.

FIG. 4 illustrates another embodiment of a light apparatus 400. In one embodiment, the light apparatus 400 may include a second optic 112 coupled to the diffuser 110. As discussed above, "coupled to" may be defined herein as being either directly connected to or indirectly connected to. For example, the second optic 112 may be directly coupled to the diffuser 110 or the first optic 108. Alternatively, the second optic 112 may be indirectly coupled to the diffuser 110 or the first optic 108. In one embodiment, the second optic 112 can be placed forward of the diffuser 110 to redistribute the light. In one embodiment, the second optic 112 may be designed to also collimate the light emitted from the diffuser 110. The second optic 112 can provide a symmetric or a non-symmetric pattern. A non-symmetric pattern is created by varying the reflector curvature at different radials.

Embodiments of the present invention eliminates color fringing by providing a novel illumination device including a plurality of LED chips 102, 104 and 106 mounted in close proximity, a first optic 108, a diffuser 110, and a second optic 112. As discussed above, the plurality of LED chips 102, 104 and 106 may each be of a different color. That is each one of the plurality of LED chips 102, 104 and 106 may emit a light each having a different wavelength.

Those skilled in the art will recognize that the present invention may use any number of LED chips, any number of different colored LED chips and any combination of different colored LED chips. That is, there may be multiple LED chips of one color and one each of additional colors or there may be one LED chip of each color and so forth. For example, the light apparatus 100 may include three LED chips. In one embodiment, the three LED chips may emit a red, a green, and a blue colored light. In one embodiment, four LED chips may be used. In one embodiment, the four LED chips may emit a red, a yellow, a green, and a blue colored light. In another embodiment, the LED chips may be red, green, blue, and white.

The LED chips may be any type of high powered LED including phosphor-based LEDs such as white, amber, or any other color where a blue or ultraviolet (UV) pump is used to excite a phosphor of a different color.

The color, or dominant wavelength, of the LED chips will affect the dynamic color mixing ability of the optical system. For example, the choice of dominant wavelength affects the resulting color gamut. Color of a specific gamut can be realized by choosing an LED die with specific dominant wavelength. Also, the choice of a LED die and, therefore, dominant wavelength, affects the efficiency or brightness, of the optical system. In one embodiment, the blue, green, red, and yellow have the dominant wavelengths of 440 nanometers (nm) to 490 nm, 505 nm to 540 nm, 585 nm to 595 nm, 615 nm to 640 nm, respectively. In one embodiment, a white LED die has a correlated color temperature between 5000 Kelvin (k) and 9000 k.

In one embodiment, the one or more LED chips 102, 104 and 106 may be powered in a way to vary a perceived light output. For example, the one or more LED chips 102, 104 and 106 can be driven using frequency modulation, pulse width modulation, pulse amplitude modulation, or any other method of varying the perceived light output as known by those skilled in the art. In one embodiment, the LED chips 102, 104 and 106 are wired in series so that a light intensity of the individual LED chips 102, 104 and 106 vary together. In another embodiment, the LED chips 102, 104 and 106 are wired individual so that a light intensity of each one of the LED chips 102, 104 and 106 can be varied individually.

In one embodiment, the first optic 108 serves to collect and direct the light emitted from each one of the one or more LED chips 102, 104 and 106 toward the diffuser 110 positioned forward of the one or more LED chips 102, 104 and 106. The first optic 108 may reduce the spread of light and, therefore, allow for a smaller design of the diffuser 110. The diffuser 110 now becomes the new source of light. Keeping the new source of light small (e.g., minimizing the beam spread) out of the diffuser 110 in turn allows for a smaller design of the second optic 112. That is to say that a smaller light source size generally results in a smaller secondary optic when the intent is to collimate or redistribute the light. Thus, the light apparatus 100 of the present invention results in a small and low-cost dynamic color mixing optical system.

Figure 5:
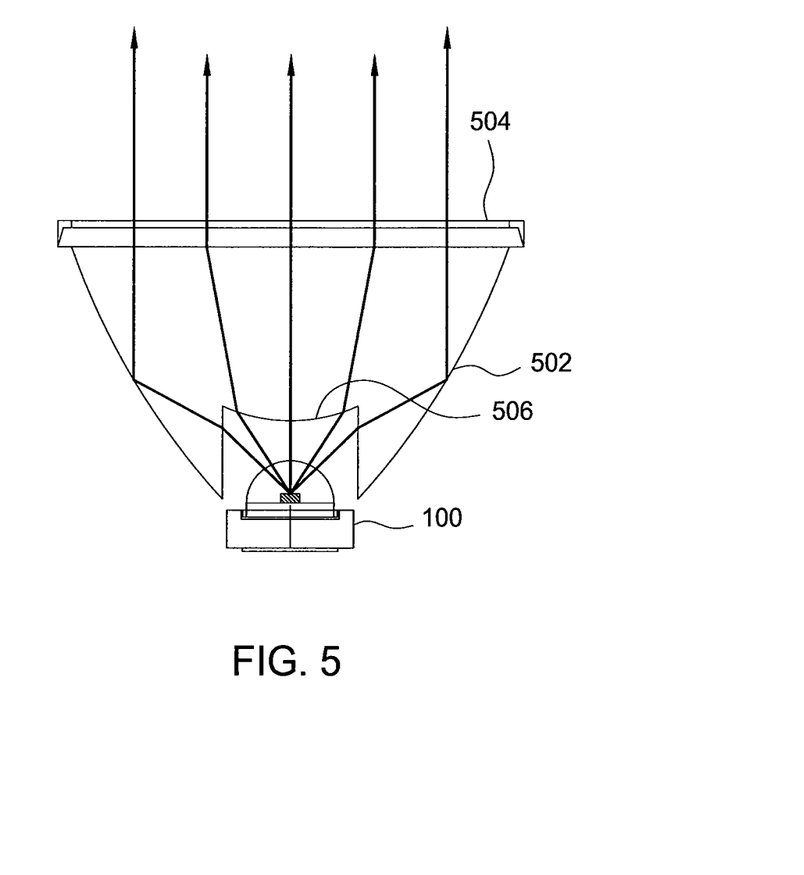
FIG. 5 depicts a total internal reflection (TIR) style optic.

The first optic 108 or the second optic 112 can be a metal or metalized reflector with a hollow inside. The first optic 108 or the second optic 112 can also be a solid total internal reflecting (TIR) optic 502, as shown in FIG. 5. In an embodiment where the first optic 108 or the second optic 112 is a TIR optic 502, a first surface 504 or a second surface 506 can be flat or have a curved lens surface. The TIR optic 502 may be placed over the high-power multi-chip package 100 as illustrated in FIG. 5.

Additional diffusers and collimating optics such as reflectors and/or lenses can be used in the light apparatus 100 to mix, collimate or redistribute the light even further. As an example, in one embodiment a second diffuser may be placed forward of the second optic 112. In another embodiment, a second diffuser may be placed before the first optic 108.

In one embodiment, the diffuser 110 can be made of ground glass or glass made with various lens patterns or random patterns. The diffuser 110 can also be made of plastic. The plastic diffuser can have any surface feature to diffuse the light emitted by each one of the one or more LED chips 102, 104 and 106. Examples include a small array of lenses or "lenslets." The plastic diffuser can have arrayed patterns or random patterns. In one embodiment, the diffuser 110 may have a diffusing surface on each side of the diffuser 110.

In one embodiment, the first optic 108 and/or the second optic 112 may have a reflector surface that is a very smooth surface to give highly specular reflections. The first optic 108 and/or the second optic 112 can also have a light texture to it to help randomize the light. The first optic 108 and/or the second optic 112 can also have small segments or facets to help randomize the light.

If a lens is used (not shown) the lens surface can have a very smooth surface. The lens surface can also have a light texture to it to help randomize the light. The lens surface can also have small segments or facets to help randomize the light.

A smaller or more efficient optical system can be achieved by keeping the various colored LED dice close together. High flux LED die are typically around 0.5 millimeter (mm) by 0.5 mm to 1.0 mm by 1.0 mm. In some cases, the LED dice are now up to 3 mm by 5 mm. In one embodiment, the spacing between the LED dice is not more than two times a width of any one of the LED dice. For example, when 1.0 mm by 1.0 mm dice are used the spacing between the dice should not be more the 2.0 mm.

The geometric dimensions of the first optic 108, the second optic 112, and the diffuser 110 are important factors that affect the light mixing and surface illumination uniformity. In one embodiment, a distance across the diffuser 110 is at least 7 times a width of an individual LED chip. In one embodiment, the distance across the diffuser 110 is no more than 50 times a width of an individual LED chip.

A distance between the LED dice 102, 104 and 106 and the diffuser 110 is also important. In one embodiment, the distance from the LED dice 102, 104 and 106 to the diffuser 110 is at least 5 times a width of an individual LED chip of the LED dice 102, 104 and 106. In one embodiment, the distance from the LED dice 102, 104 and 106 to the diffuser 110 is at no more than 50 times a width of an individual LED chip of the LED dice 102, 104 and 106.

In one embodiment, the first optic 108 and/or the second optic 112 cross sectional surfaces are conic or substantially conic. A conic cross section is a curve that can be formed by intersecting a plane through a cone. Conic shapes are used commonly in reflectors and are defined by the function:

$$z = \frac{cr^2}{1 + \sqrt{1 - (1+k)c^2 r^2}} \quad (1)$$

$$r^2 = x^2 + y^2$$

where x, y, and z are positions on a typical 3-axis system, k is the conic constant, and c is the curvature. Hyperbolas ($k<-1$), parabolas ($k=-1$), ellipses ($-1 \leq k \leq 0$), spheres ($k=0$), and oblate spheres ($k>0$) are all forms of conics. Changing k and c will change the shape of the illumination/intensity pattern.

One can also modify the basic conic shape by using additional mathematical terms. An example is the following polynomial:

$$z = \frac{cr^2}{1 + \sqrt{1 - (1+k)c^2 r^2}} + F(y) \quad (2)$$

where F(y) is a variable function, and in the case of an a sphere, F(y) can equal $$\sum_{n=2}^{10} C_{2n} r^{2n},$$

in which C is a constant. In one embodiment, F(y) is not equal to zero, and equation (1) provides a cross-sectional shape which is modified relative to a conic shape by an additional mathematical term or terms represented by F(y). For example, F(y) can be chosen to modify a conic shape to alter the reflected light intensity distribution in some desirable manner. Also, in one embodiment, F(y) can be used to provide a cross-sectional shape which approximates other shapes, or accommodates a tolerance factor in regards to a conic shape. For example, F(y) may be set to provide cross-sectional shape having a predetermined tolerance relative to a conic cross-section. In one embodiment, F(y) is set to provide values of z which are within 10% of the values provided by the same equation but with F(y) equal to zero. In other words, it is within the scope of the present invention to modify equation (1) above in any manner, e.g., using a variable function F(y) or otherwise, that results in a value of z within 10% of equation (1) using the same values of c, r and k in equation (1) and a modified version of equation (1). Conic shapes can also be reproduced and/or modified using a set of points and a basic curve such as spline fit. In one embodiment, the cross sectional of the first optic 108 and/or the second optic 112 follow equation (1) to within +/−10%.

Figure 6:
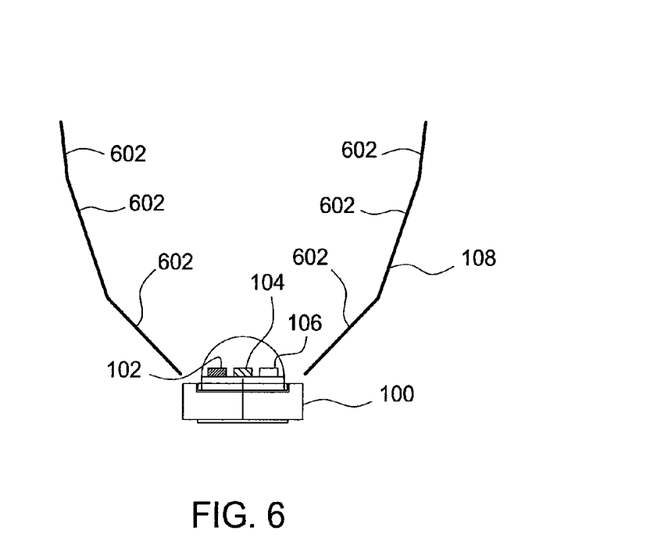
FIG. 6 depicts an illustrative embodiment of a faceted first optic.

In another embodiment illustrated by FIG. 6, the first optic 108 and/or the second optic 112 comprises a reflecting surface which is a faceted surface which has a shape which approximates a conic shape. The faceted surface comprises a plurality of individual planar facets 602. Collectively, the plurality of individual planar facets 602 approximate a conic shape, with the approximation becoming more accurate as the individual planar facets 602 are made smaller.

Figure 7:
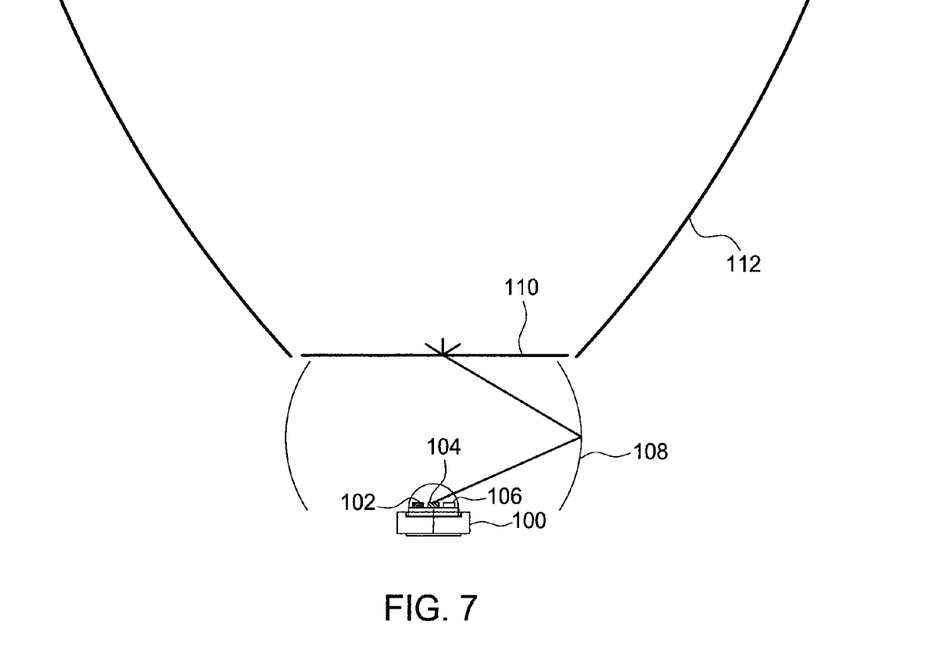
FIG. 7 depicts an illustrative embodiment of a first optic having an elliptical or substantially elliptical cross-section.

Using a reflector cross section that has a concave curvature works to collimate or direct the light forward. In the embodiment shown in FIG. 4, the first optic 108 has a parabolic or substantially parabolic profile to direct the light forward as much as possible. In an alternative embodiment shown in FIG. 7, the first optic 108 may have a cross-section that has an elliptical or substantially elliptical profile to direct the light to a center of the diffuser 110 as much as possible. In other words, the embodiment illustrated in FIG. 7 shows where the first optic 108 has a cross-section surface that is initially angled away from the one or more LED chips 102, 104 and 106, becomes parallel to a central light emitting axis of the one or more LED chips 102, 104 and 106, and then is angled toward the one or more LED chips 102, 104 and 106. In another embodiment the first optic 108 may have a cross section that has little or no curvature and approximates a cone when revolved around the LEDs.

As mentioned earlier, the first optic 108 and/or the second optic 112 may have reflector surfaces that can be different at different radials to give a non-symmetric radial pattern. That is to say that the first optic 108 and/or the second optic 112 does not have to be limited to a single curvature that is revolved around the optical axis. Another example would be a linear or extruded optic where the reflector forms a trough.

Figure 8:
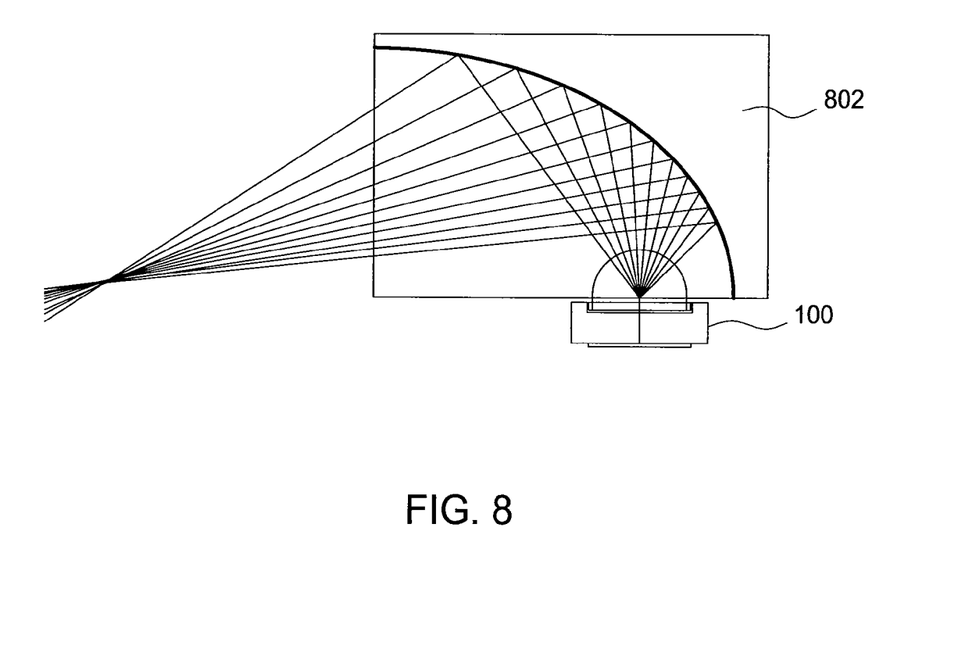
FIG. 8 depicts an illustrative embodiment where half of a collimating optic is removed.

In another embodiment, a portion of the first optic 108 and/or the second optic 112 may be removed and the high-power multi-chip package 100 having one or more LED chips 102, 104 and 106 may be angled to the first optic 108 and/or the second optic 112. FIG. 8 shows an embodiment where half of a collimating optic 802 is removed and a central light emitting axis of the high-power multi-chip package 100 is angled at about 90 degrees with respect to a central light emitting axis of the collimating optic 802. In another embodiment, the high-power multi-chip package 100 may be angled at about 45 degrees to the central light emitting axis of the collimating optic 802. In one embodiment the central light emitting axis of the collimating optic 802 is defined as an axis were light emitted by the high-power multi-chip package 100 is most centered and concentrated.

Figure 9:
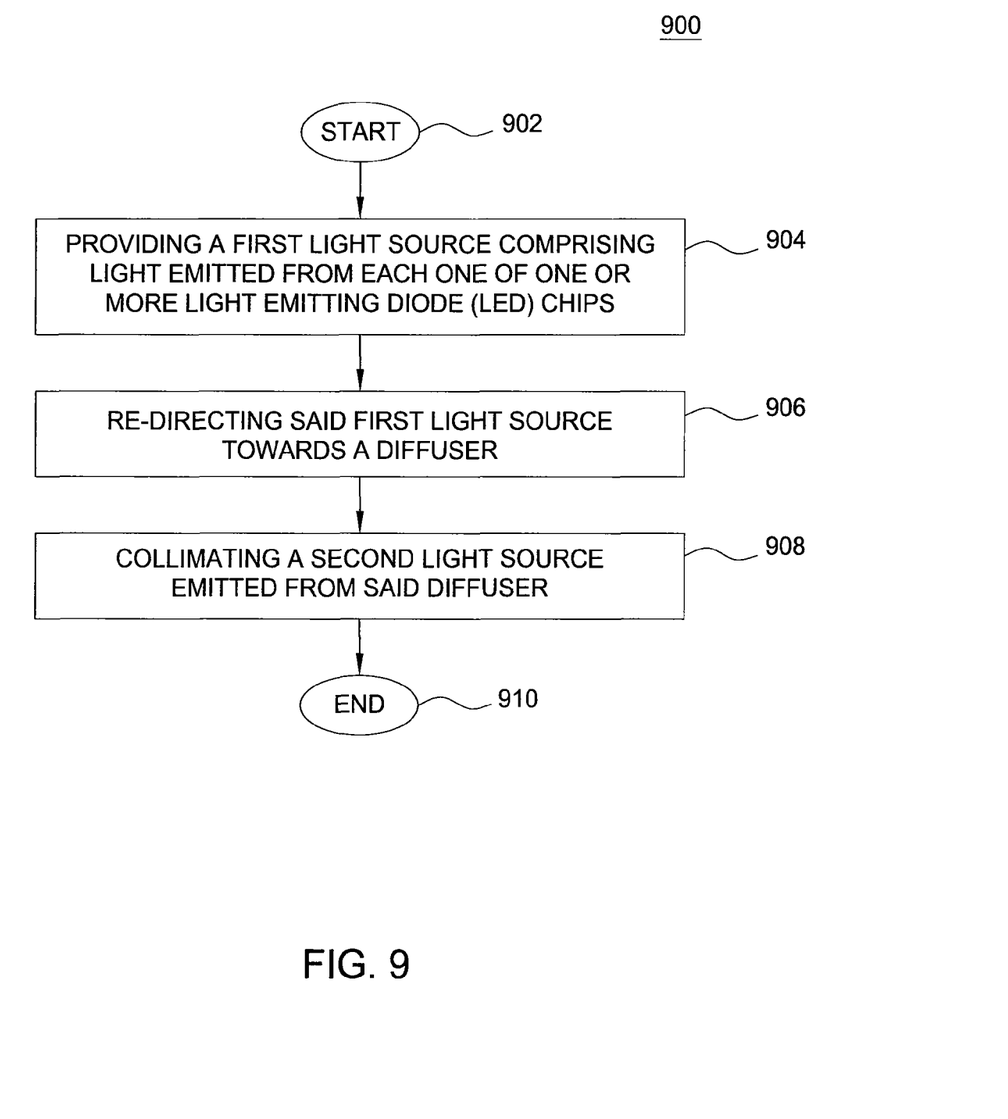
FIG. 9 depicts an illustrative embodiment of a method for eliminating color fringing.

FIG. 9 illustrates a method 900 for eliminating color fringing. In one embodiment, the method may be carried out by the lighting apparatus 100. The method begins at step 902. At step 904, the method provides a first light source comprising light emitted from each one of the one or more light emitting diode (LED) chips. For example, the one or more LED chips 102, 104 and 106 may be contained in a high-powered multi-chip package 100 as illustrated in FIG. 1.

At step 906, the first light source is re-directed towards a diffuser. For example, the first light source may be re-directed by a first optic 108 as illustrated in FIGS. 2-4. As discussed above, the first optic 108 may collimate the first light source towards the diffuser. The diffuser may be for example diffuser 110 discussed above with respect to FIGS. 3 and 4.

At step 908, the method 900 collimates a second light source emitted from a diffuser. For example, a second optic 112 may be used as illustrated in FIG. 4. The method 900 concludes with step 910.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A lighting apparatus, comprising:
a plurality of light emitting diode (LED) chips, wherein said plurality of LED chips is contained in a multi-chip package, wherein a spacing between said plurality of LED chips is not more than two times a width of any one of said plurality of LED chips;
a first optic coupled to said multi-chip package, wherein the first optic comprises a metalized reflector having a plurality of individual planar facets with a hollow inside having an elliptical shape;
a diffuser coupled to said first optic, wherein the elliptical shape of the said first optic directs a light emitted from said multi-chip package towards a center of said diffuser; and
a second optic coupled to said diffuser.

2. The lighting apparatus of claim 1, wherein each one of said plurality of LED chips is a different color.

3. The lighting apparatus of claim 2, wherein said plurality of LED chips comprises a red LED chip, a green LED chip and a blue LED chip.

4. The lighting apparatus of claim 1, wherein said first optic is placed forward of said plurality of LED chips, said diffuser is placed forward of said first optic and said second optic is placed forward of said diffuser.

5. The lighting apparatus of claim 1, wherein said first optic comprises one or more reflective surfaces for collimating light emitted from each one of said plurality of LED chips.

6. The lighting apparatus of claim 1, wherein said second optic comprises one or more reflective surfaces for collimating light that passes through said diffuser.

7. A lighting apparatus, comprising:
a plurality of light emitting means, wherein said plurality of light emitting means is contained in a multi-chip package, wherein a spacing between said plurality of light emitting means is not more than two times a width of any one of said plurality of light emitting means;
a first means for redirecting a light emitted from said plurality of light emitting means, wherein said first means for redirecting is coupled to said multi-chip package, wherein the first means for redirecting comprises a metalized reflector having a plurality of individual planar facets with a hollow inside having an elliptical shape;
means for diffusing said light emitted from said plurality of light emitting means, wherein said means for diffusing is coupled to said first means for redirecting said light emitted from said plurality of light emitting means, wherein the elliptical shape of the said first means for redirecting directs said light emitted from said multi-chip package towards a center of said means for diffusing; and
a second means for redirecting a light emitted from said means for diffusing, wherein said second means for redirecting is coupled to said means for diffusing.

8. The lighting apparatus of claim 7, wherein each one of said plurality of light emitting means is a different color.

9. The lighting apparatus of claim 8, wherein said plurality of light emitting means comprises a red light emitting means, a green light emitting means and a blue light emitting means.

10. The lighting apparatus of claim 7, wherein said first means for redirecting is placed forward of said plurality of light emitting means, said means for diffusing is placed forward of said first means for redirecting and said second means for redirecting is placed forward of said means for diffusing.

11. The lighting apparatus of claim 7, wherein said first means for redirecting comprises one or more reflective surfaces for collimating said light emitted from each one of said plurality of light emitting means.

12. The lighting apparatus of claim 7, wherein said second means for redirecting comprises one or more reflective surfaces for collimating said light that passes through said means for diffusing.

13. A method for eliminating color fringing, comprising:
providing a first light source comprising a light emitted from each one of a plurality of light emitting diode (LED) chips, wherein said plurality of LED chips is contained in a multi-chip package, wherein a spacing between said plurality of LED chips is not more than two times a width of any one of said plurality of LED chips;
redirecting said first light source via a first optic towards a center of a diffuser coupled to the multi-chip package, wherein the first optic comprises a metalized reflector having a plurality of individual planar facets with a hollow inside having an elliptical shape; and
collimating via a second optic a second light source emitted from said diffuser.

14. The method of claim 13, wherein each one of said plurality of LED chips is a different color.

15. The method of claim 14, wherein said plurality of LED chips comprises a red LED chip, a green LED chip and a blue LED chip.

16. The method of claim 13, wherein said redirecting comprises collimating said first light source towards said diffuser.

17. The lighting apparatus of claim 1, wherein a gap is provided between said plurality of LED chips and the first optic.

18. The lighting apparatus of claim 7, wherein a gap is provided between said plurality of light emitting means and the first means for redirecting.

* * * * *

UNITED STATES PATENT AND TRADEMARK OFFICE
CERTIFICATE OF CORRECTION

PATENT NO.         : 8,907,368 B2
APPLICATION NO.    : 12/266858
DATED              : December 9, 2014
INVENTOR(S)        : John Patrick Peck Page 1 of 1

It is certified that error appears in the above-identified patent and that said Letters Patent is hereby corrected as shown below:

In the specification

Column 5, line 44, delete "$(-1 \leq k \leq 0)$," and insert -- $(-1 < k < 0)$, --, therefor.

Column 6, line 20, delete "kin" and insert -- k in --, therefor.

Signed and Sealed this
Eighth Day of December, 2015

Michelle K. Lee
*Director of the United States Patent and Trademark Office*